United States Patent
Liu et al.

(10) Patent No.: US 11,837,439 B2
(45) Date of Patent: Dec. 5, 2023

(54) INDUCTIVELY COUPLED PLASMA TREATMENT SYSTEM

(71) Applicant: JIANGSU LEUVEN INSTRUMENTS CO. LTD, Jiangsu (CN)

(72) Inventors: Haiyang Liu, Jiangsu (CN); Xiaobo Liu, Jiangsu (CN); Xuedong Li, Jiangsu (CN); Na Li, Jiangsu (CN); Shiran Cheng, Jiangsu (CN); Song Guo, Jiangsu (CN); Dongdong Hu, Jiangsu (CN); Kaidong Xu, Jiangsu (CN)

(73) Assignee: JIANGSU LEUVEN INSTRUMENTS CO. LTD, Jiangsu (CN)

( * ) Notice: Subject to any disclaimer, the term of this patent is extended or adjusted under 35 U.S.C. 154(b) by 199 days.

(21) Appl. No.: 17/628,225

(22) PCT Filed: Feb. 26, 2020

(86) PCT No.: PCT/CN2020/076758
§ 371 (c)(1),
(2) Date: Jan. 19, 2022

(87) PCT Pub. No.: WO2021/017463
PCT Pub. Date: Feb. 4, 2021

(65) Prior Publication Data
US 2022/0254604 A1 Aug. 11, 2022

(30) Foreign Application Priority Data
Jul. 30, 2019 (CN) .......................... 201910694285.6

(51) Int. Cl.
*H01J 37/32* (2006.01)

(52) U.S. Cl.
CPC ...... *H01J 37/321* (2013.01); *H01J 37/32183* (2013.01); *H01J 37/32477* (2013.01); *H01J 37/32651* (2013.01); *H01J 37/32862* (2013.01)

(58) Field of Classification Search
CPC ............... H01J 37/321; H01J 37/32119; H01J 37/32183; H01J 37/32477;
(Continued)

(56) References Cited

U.S. PATENT DOCUMENTS 7,833,429 B2 * 11/2010 Nishio ............. H01J 37/32697
216/63
9,805,915 B2 * 10/2017 Gushiken .......... H01J 37/32174
(Continued)

FOREIGN PATENT DOCUMENTS

CN 202873172 4/2013
CN 106469636 3/2017
(Continued)

OTHER PUBLICATIONS

"International Search Report (Form PCT/ISA/210) of PCT/CN2020/076758," dated May 21, 2021, with English translation thereof, pp. 1-4.
(Continued)

*Primary Examiner* — Monica C King
(74) *Attorney, Agent, or Firm* — JCIPRNET (57) ABSTRACT

Disclosed in the present application is an inductively coupled plasma treatment system. Said system switches the connection between a radio frequency coil and a faraday shielding device by means of a switch switching radio frequency power. When a radio frequency power supply is connected to the radio frequency coil by means of a matched network, the radio frequency power is coupled into the radio frequency coil to perform plasma treatment process. When a radio frequency power supply is connected to a faraday
(Continued)

shielding device by means of a matched network, the radio frequency power is coupled into the faraday shielding device to perform cleaning process on a dielectric window and an inner wall of a plasma treatment cavity.

10 Claims, 5 Drawing Sheets

(58) Field of Classification Search
CPC .......... H01J 37/32651; H01J 37/32862; H01J 2237/334; H01J 37/32431; H01J 37/32
See application file for complete search history.

(56) References Cited

U.S. PATENT DOCUMENTS

2003/0062840 A1* 4/2003 Moroz .................. H01J 37/321
                                                           315/111.51
2003/0173030 A1* 9/2003 Ishii ...................... C23C 16/511
                                                           118/723 MW
2022/0254649 A1* 8/2022 Tan ................... H01J 37/32899

FOREIGN PATENT DOCUMENTS

| | | |
|---|---|---|
| CN | 110416053 | 11/2019 |
| JP | 2008243917 | 10/2008 |
| JP | 2017143059 | 8/2017 |
| JP | 2017199649 | 11/2017 |

OTHER PUBLICATIONS

"Written Opinion of the International Searching Authority (Form PCT/ISA/237) of PCT/CN2020/076758," dated May 21, 2021, pp. 1-6.

* cited by examiner

INDUCTIVELY COUPLED PLASMA TREATMENT SYSTEM

CROSS-REFERENCE TO RELATED APPLICATION

This application is a 371 of international application of PCT application serial no. PCT/CN2020/076758, filed on Feb. 26, 2020, which claims the priority benefit of China application no. 201910694285.6, filed on Jul. 30, 2019. The entirety of each of the above mentioned patent applications is hereby incorporated by reference herein and made a part of this specification.

TECHNICAL FIELD

The present invention belongs to the field of faraday shielding system technologies, and in particular, to an inductively coupled plasma (ICP) processing system.

DESCRIPTION OF RELATED ART

Currently, nonvolatile materials such as Pt, Ru, Ir, NiFe, and Au are mainly dry etched by ICP. ICP is usually generated by a coil that is placed outside a plasma processing chamber and is adjacent to a dielectric window, and process gas inside the chamber is ignited to form the plasma. However, it is inevitable and to some extent undesired that a voltage between different parts of a plasma coil is capacitively coupled into plasma. Although such coupling promotes ignition and stabilization, the capacitively coupled parts may induce locally enhanced voltages throughout a plasma sheath. As a result, the departure of ions from the plasma may be accelerated to locally affect the dielectric window, causing local sputtering damage. In other cases, capacitive coupling may lead to local deposition. Sputtered particles may aggregate in an area right below the coil. During chip processing, sputtering may cause damage to a surface coating on the dielectric window, and then particles may fall off and fall on a manufactured chip to cause defects. During chipless cleaning to remove such particles, the cleaning may be uneven. The cleaning is mostly performed right below the coil, and areas far away from the coil are only slightly cleaned. As a result, the window is unevenly cleaned, and contaminants may still be generated to cause defects in a chip. During a dry etching process of a nonvolatile material, the vapor pressure of reaction products is low, making it difficult to pump away the reaction products by a vacuum pump. As a result, the reaction products are deposited on inner walls of the dielectric window and another plasma processing chamber. Particle contamination is caused, and the process drifts over time and becomes less repeatable. Therefore, the plasma processing chambers need to be cleaned. However, during actual use, cleaning leads to process interruptions and reduces the production efficiency of plasma processing equipment.

With the continuous development and increasing integration of the third generation memory, that is, magnetoresistive random access memory (MRAM), in recent years, the demand for dry etching of new nonvolatile materials such as metal gate materials (for example, Mo and Ta) and high-k gate dielectric materials (for example, $Al_2O_3$, $HfO_2$, and $ZrO_2$) keeps increasing, and it becomes very necessary to solve sidewall deposition and particle contamination that occur during dry etching of the nonvolatile materials while improving the efficiency of a cleaning process in a plasma processing chamber.

For control and more uniform capacitively coupled parts of the coil, an electrostatic shielding member may be used. A faraday shield is used in a plasma processing chamber to reduce the erosion of a chamber material by plasma. However, some plasma may still enter through slits between faraday shielding units to contaminate a dielectric window. The faraday shield is placed between a radio frequency coil and the dielectric window, so that the erosion of walls of a chamber by ions induced by a radio frequency electric field can be reduced. Such shield may be grounded or floating. When the faraday shield is grounded, it becomes very difficult to initiate a plasma discharge because a radio frequency electric field strength is reduced due to reduced capacitive coupling. When the plasma uses a floating design, the excitation of the plasma is excessively hindered, but is not very effective in preventing the erosion of the chamber by the plasma. Meanwhile, a faraday device is located between the radio frequency coil and the dielectric window. The installation and insulation of the radio frequency coil and the faraday device become very complex, and later maintenance becomes increasingly difficult.

SUMMARY

Technical Problem to be Solved

The present application mainly proposes an ICP processing system, to solve technical problems such as local sputtering damage, uneven window cleaning, difficult later maintenance, and reduced production efficiency of plasma processing equipment in the prior art.

Technical Solutions

An ICP processing system is provided, including a plasma reaction chamber, an excitation radio frequency power source, a matching network A, a radio frequency coil, a dielectric window, a bias radio frequency power source, a matching network B, an electrode, a substrate, a gas source, a gas inlet, a pressure control valve, a vacuum pump, and a three-way switch, where the excitation radio frequency power source is tuned by the matching network A, and then supplies power to the radio frequency coil located above the dielectric window through the three-way switch after tuning, plasma is generated in the plasma reaction chamber through inductive coupling, the bias radio frequency power source supplies power to the electrode through the matching network B, and the substrate is placed on the electrode; the radio frequency coil includes two or more sub-coils, and the radio frequency coil has one radio frequency power source; and the gas source is connected to the plasma reaction chamber by the gas inlet, and the pressure control valve and the vacuum pump maintain the plasma reaction chamber at 1 mtorr to 100 mtorr, and remove excess gas and reaction byproducts in the plasma reaction chamber.

In a preferred technical solution of the present invention, the excitation radio frequency power source and the bias radio frequency power source are both set to a specific frequency, and the specific frequency is, for example, one or a combination of a plurality of frequencies 400 KHz, 2 MHz, 13.56 MHz, 27 MHz, 60 MHz, and 2.54 GHz.

In a preferred technical solution of the present invention, an yttrium oxide coating is sprayed at the bottom of the dielectric window, the thickness of the yttrium oxide coating is greater than or equal to 50 micrometers, a layer of a faraday shielding device is sprayed on the yttrium oxide coating, a thickness of the spraying is greater than or equal to 50 micrometers, to prevent the faraday shielding device from contaminating the chamber and to protect the dielectric window and the faraday shielding device from being damaged by process etching, a spraying range of the yttrium oxide coating is greater than a maximum diameter of the faraday shielding device, the dielectric window is manufactured by sintering aluminum oxide, an electrical lead post is sintered or brazed at the bottom of the dielectric window, and the electrical lead post is connected to an electrical lead wire and is connected to the three-way switch by the electrical lead wire.

In a preferred technical solution of the present invention, the material of the faraday shielding device is silicon carbide or zinc oxide.

In a preferred technical solution of the present invention, when the electrical lead post and the dielectric window are sintered together, the material of the electrical lead post is copper, silver, gold or palladium with a high coefficient of electrical conductivity, and when the electrical lead post and the dielectric window are brazed together, the material of the electrical lead post is Kovar.

In a preferred technical solution of the present invention, during the plasma processing process, the substrate is placed in the plasma reaction chamber, plasma processing process reaction gas that enters the plasma reaction chamber from the gas source is introduced into the reaction chamber, the pressure control valve and the vacuum pump maintain the plasma reaction chamber at 1 mtorr to 100 mtorr, an on position of the three-way switch is switched to enable the excitation radio frequency power source to be tuned by the matching network A to supply power to the radio frequency coil located above the dielectric window, plasma is generated in the plasma reaction chamber through inductive coupling to perform the plasma processing process on the substrate, after the plasma processing process is completed, input of radio frequency power from the excitation radio frequency power source is stopped, and feeding of the plasma processing process reaction gas from the gas source is stopped, when a cleaning process is required, the substrate is placed in the plasma reaction chamber, cleaning process reaction gas is introduced into the plasma reaction chamber, the pressure control valve and the vacuum pump maintain the plasma reaction chamber at 1 mtorr to 100 mtorr, the on position of the three-way switch is switched to enable the excitation radio frequency power source to be tuned by the matching network A to supply power to the faraday shielding device located between the dielectric window and the radio frequency coil, the radio frequency power is coupled into the faraday shielding device, the plasma reaction chamber and the dielectric window are cleaned, and after the cleaning process is completed, the input of the radio frequency power from the excitation radio frequency power source is stopped, and the feeding of the cleaning process reaction gas from the gas source is stopped.

In a preferred technical solution of the present invention, specific operations of the ICP processing system when the cleaning process is required are as follows: through switching of the three-way switch, the excitation radio frequency power source is tuned by the matching network A to supply power to the faraday shielding device through the electrical lead wire and the electrical lead post, the gas source is connected to the plasma reaction chamber by the gas inlet, the cleaning process reaction gas is introduced into the plasma reaction chamber, and the pressure control valve and the vacuum pump maintain the plasma reaction chamber at 1 mtorr to 100 mtorr, and remove excess gas and reaction byproducts in the plasma reaction chamber.

In a preferred technical solution of the present invention, the faraday shielding device is formed by a group of petal sheet-shaped components of the same shape, slits between every two adjacent petal sheet-shaped components are of the same shape and size, the petal sheet-shaped components are rotationally symmetrically distributed around a vertical axis, an end of each petal sheet-shaped component close to the vertical axis is connected to a conductive member, the conductive member is formed by two sector conductive members that are of the same radian and size and are separate and insulated from each other, the conductive member is sprayed on the electrical lead post, and the two sector conductive members are connected in parallel by the electrical lead post and the electrical lead wire to the radio frequency matching network A to implement a connection to the excitation radio frequency power source.

In a preferred technical solution of the present invention, the faraday shielding device is formed by a group of blade sheet-shaped components of the same shape, slits between every two adjacent blade sheet-shaped components are of the same shape and size, the blade sheet-shaped components are rotationally symmetrically distributed around a vertical axis, an end of each blade sheet-shaped component close to the vertical axis is connected to a conductive member, the conductive member is formed by two sector conductive members that are of the same radian and size and are separate and insulated from each other, the conductive member is sprayed on the electrical lead post, and the two sector conductive members are connected in parallel by the electrical lead post and the electrical lead wire to the radio frequency matching network A to implement a connection to the excitation radio frequency power source.

In a preferred technical solution of the present invention, the diameter of the faraday shielding device is greater than 80% of the diameter of the substrate, the radius of the conductive member does not exceed 10% of the radius of the substrate, during a plasma processing process, when the radio frequency power is coupled into the radio frequency coil through the matching network A, the faraday shielding device is grounded by the electrical lead post and the electrical lead wire or is floating to reduce the erosion of the inner wall of the chamber, especially the dielectric window, by the plasma, thereby reducing a cleaning time after the process ends, and the floating is that the faraday shielding device is neither grounded nor connected to radio frequency.

By the ICP processing system in the present application, compared with the prior art, the foregoing technical solutions have the following technical effects:

1. In the system, a switch is used to switch between a connection between radio frequency power and a radio frequency coil and a connection between radio frequency power and the faraday shielding device. When a radio frequency power source is connected to the radio frequency coil by a matching network, the radio frequency power is coupled into the radio frequency coil to perform the plasma processing process. When the radio frequency power source is connected to the faraday shielding device by a matching network, the radio frequency power is coupled into the faraday shielding device to perform a cleaning process on inner walls of the dielectric window and of a plasma processing chamber.

2. Since the faraday system and the dielectric window are the same part, the installation and maintenance of the radio frequency coil are facilitated, and the inner wall of the plasma processing chamber, especially the dielectric window, is efficiently cleaned.

3. According to requirements of different plasma processing processes and/or cleaning processes, in the same plasma processing process or cleaning process, via a matching device, the radio frequency power source may be switched at will between the radio frequency coil and the faraday shielding device by using a switchable switch, to meet requirements of the plasma processing process or cleaning process.

4. During a cleaning process, via the matching device, the radio frequency power source may be first connected to the coil by the switchable switch. After the ignition of plasma is stabilized, the switch is then used to connect the radio frequency power source to the faraday shielding device via the matching device, to enter a cleaning process procedure.

5. The structural design is simple, the faraday shielding device and the dielectric window are formed into the same part, and the manufacturing is relatively easy, so that later installation and maintenance of the equipment is simplified, a lot of space is saved, and in addition the inner wall of the plasma processing chamber, especially the dielectric window, is efficiently cleaned.

6. Compared with a one-piece conductive ring, the conductive member is formed by two sector conductive members that are of the same radian and size and are separate and insulated from each other, so that an eddy current of a current in the conductive member is reduced, the coupling of the radio frequency power into the faraday shielding device is improved, and the cleaning efficiency of the inner wall of the plasma processing chamber, especially the dielectric window and a spray header by the faraday shielding device is improved.

7. The faraday shielding device is grounded by the electrical lead post and the electrical lead wire or is floating, that is, neither grounded nor connected to radio frequency to reduce the erosion of the inner wall of the chamber, especially the dielectric window, by the plasma, thereby reducing a cleaning time after the process ends.

Reference numerals: 102—plasma reaction chamber, 104—excitation radio frequency power source, 106—matching network A, 108—radio frequency coil, 110—dielectric window, 114—bias radio frequency power source, 116—matching network B, 118—electrode, 120—substrate, 130—gas source, 140—gas inlet, 142—pressure control valve, 144—vacuum pump, 150—three-way switch, 160—faraday shielding device, 202—blade sheet-shaped component, 204—conductive member, 210—electrical lead wire, 211—electrical lead post, and 212—petal sheet-shaped component.

DESCRIPTION OF THE EMBODIMENTS

The technical solutions of the present invention are described below in detail with reference to the accompanying drawings. For the faraday shielding device 160, the following two specific embodiments are provided. In addition to the two structures, the present invention may further be formed by sheet components of a triangular shape, a quadrilateral shape, a bow shape, a crescent shape or the like.

Embodiment 1

Figure 1:
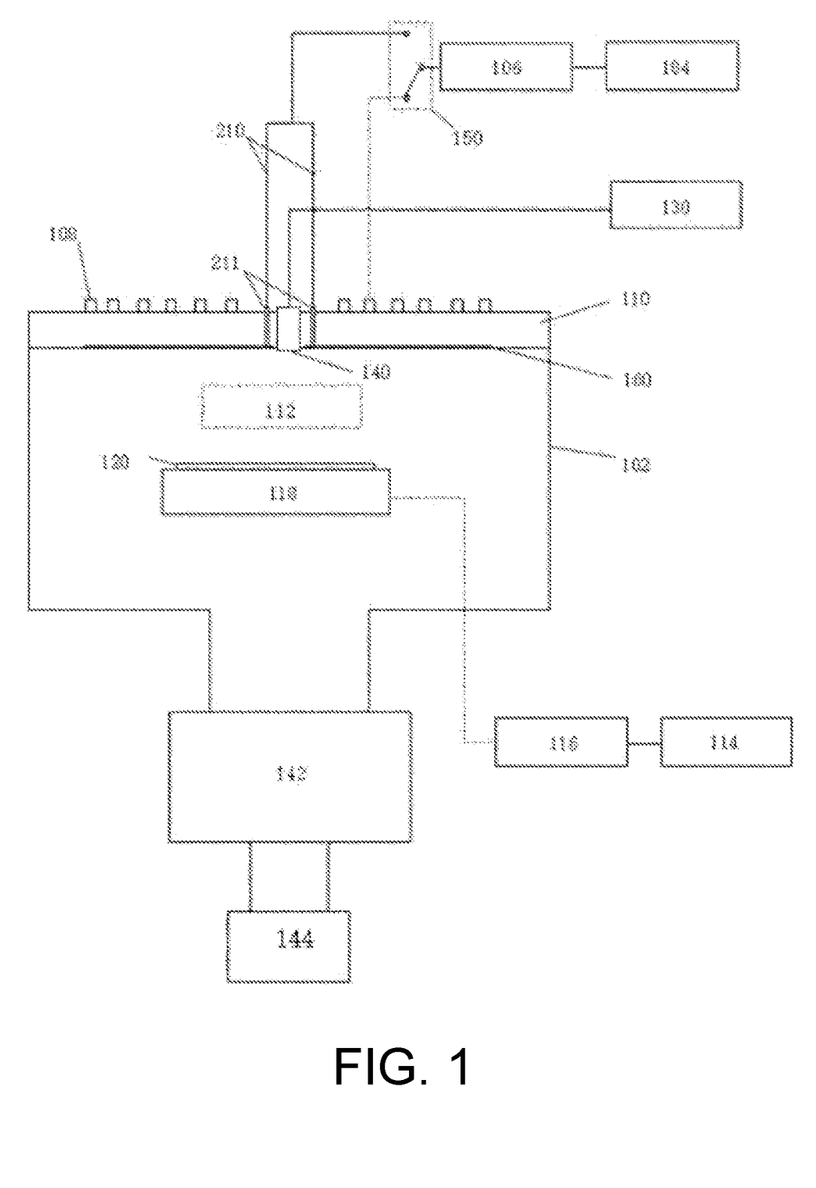
FIG. 1 is a schematic structural diagram of an ICP processing system in the present application.

As shown in FIG. 1, an ICP processing system is provided. The ICP processing system includes a plasma reaction chamber 102, an excitation radio frequency power source 104, a matching network A106, a radio frequency coil 108, a dielectric window 110, a bias radio frequency power source 114, a matching network B116, an electrode 118, a substrate 120, a gas source 130, a gas inlet 140, a pressure control valve 142, a vacuum pump 144, and a three-way switch 150. The excitation radio frequency power source 104 is tuned by the matching network A106, and then supplies power to the radio frequency coil 108 located above the dielectric window 110 through the three-way switch 150 after tuning. Plasma 112 is generated in the plasma reaction chamber 102 through inductive coupling. The bias radio frequency power source 114 supplies power to the electrode 118 through the matching network B116. The substrate 120 is placed on the electrode 118. The radio frequency coil 108 includes two or more sub-coils. The radio frequency coil 108 has one radio frequency power source. A gas source 130 is connected to the plasma reaction chamber 102 by the gas inlet 140. The pressure control valve 142 and the vacuum pump 144, maintain the plasma reaction chamber 102 at 1 mtorr to 100 mtorr, and remove excess gas and reaction byproducts in the plasma reaction chamber 102. The excitation radio frequency power source 104 and the bias radio frequency power source 114 are both set to a specific frequency. The specific frequency is one or a combination of a plurality of frequencies 400 KHz, 2 MHz, 13.56 MHz, 27 MHz, 60 MHz, and 2.54 GHz.

Figure 3:
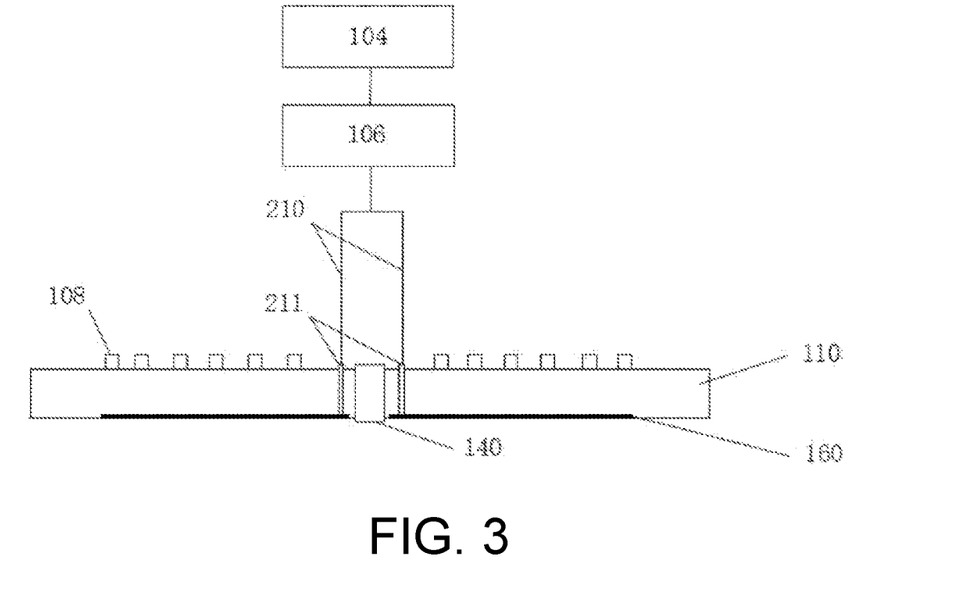
FIG. 3 is a schematic diagram of coupling between faraday and radio frequency in an ICP processing system in the present application.
Figure 4:
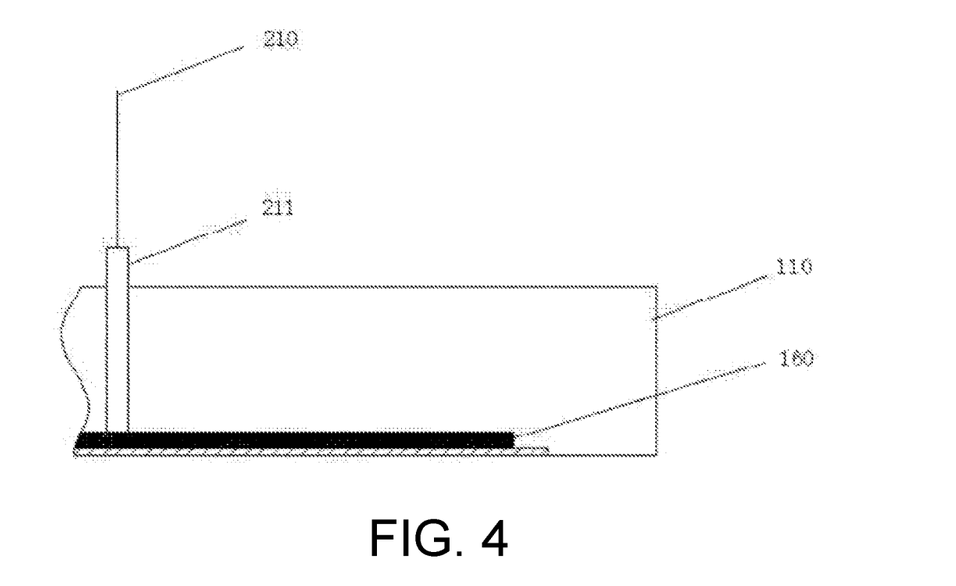
FIG. 4 is a schematic diagram of a faraday spraying structure in an ICP processing system in the present application.

As shown in FIG. 3 and FIG. 4, an yttrium oxide coating is sprayed at the bottom of the dielectric window 110. The thickness of the yttrium oxide coating is greater than or equal to 50 micrometers. A layer of a faraday shielding device 160 is sprayed on the yttrium oxide coating. A thickness of the spraying is greater than or equal to 50 micrometers. To prevent the faraday shielding device 160 from contaminating the chamber and to protect the dielectric window 110 and the faraday shielding device 160 from being damaged by process etching, a spraying range of the yttrium oxide coating is greater than a maximum diameter of the faraday shielding device 160. The dielectric window 110 is manufactured by sintering aluminum oxide. An electrical lead post 211 is sintered or brazed at the bottom of the dielectric window 110. The electrical lead post 211 is connected to an electrical lead wire 210 and is connected to the three-way switch 150 by the electrical lead wire 210. The material of the faraday shielding device 160 is silicon carbide or zinc oxide. When the electrical lead post 211 and the dielectric window 110 are sintered together, the material of the electrical lead post 211 is copper, silver, gold or palladium with a high coefficient of electrical conductivity. When the electrical lead post 211 and the dielectric window 110 are brazed together, the material of the electrical lead post 211 is Kovar.

Figure 2:
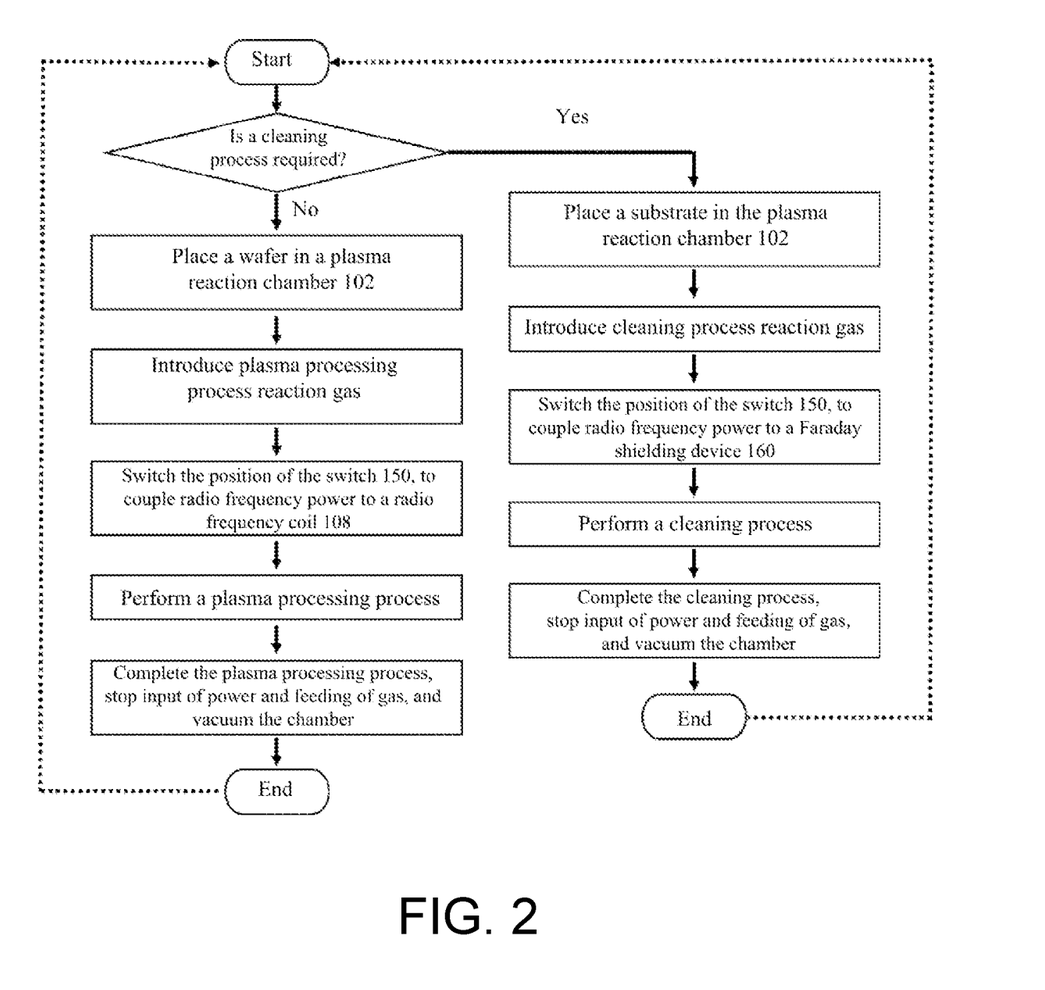
FIG. 2 is a flowchart of cleaning an ICP processing system in the present application.

As shown in FIG. 2, during a plasma processing process, the substrate 120 is placed in the plasma reaction chamber 102, and plasma processing process reaction gas that enters the plasma reaction chamber 102 from the gas source 130 is introduced into the reaction chamber. The pressure control valve 142 and the vacuum pump 144 maintain the plasma reaction chamber 102 at 1 mtorr to 100 mtorr. An on position of the three-way switch 150 is switched to enable the excitation radio frequency power source 104 to be tuned by the matching network A106 to supply power to the radio frequency coil 108 located above the dielectric window 110. The plasma 112 is generated in the plasma reaction chamber 102 through inductive coupling to perform the plasma processing process on the substrate 120. After the plasma processing process is completed, input of radio frequency power from the excitation radio frequency power source 104 is stopped, and feeding of the plasma processing process reaction gas from the gas source 130 is stopped. When a cleaning process is required, the substrate 120 is placed in the plasma reaction chamber 102. Cleaning process reaction gas is introduced into the plasma reaction chamber 102. The pressure control valve 142 and the vacuum pump 144 maintain the plasma reaction chamber 102 at 1 mtorr to 100 mtorr. The on position of the three-way switch 150 is switched to enable the excitation radio frequency power source 104 to be tuned by the matching network A106 to supply power to the faraday shielding device 160 located between the dielectric window 110 and the radio frequency coil 108. The radio frequency power is coupled into the faraday shielding device 160. The plasma reaction chamber and the dielectric window are cleaned. After the cleaning process is completed, the input of the radio frequency power from the excitation radio frequency power source 104 is stopped, and the feeding of the cleaning process reaction gas from the gas source 130 is stopped. Specific operations of the ICP processing system when the cleaning process is required are as follows: Through switching of the three-way switch 150, the excitation radio frequency power source 104 is tuned by the matching network A106 to supply power to the faraday shielding device 160 through the electrical lead wire 210 and the electrical lead post 211. The gas source 130 is connected to the plasma reaction chamber 102 by the gas inlet 140. The cleaning process reaction gas is introduced into the plasma reaction chamber 102. The pressure control valve 142 and the vacuum pump 144 maintain the plasma reaction chamber 102 at 1 mtorr to 100 mtorr, and remove excess gas and reaction byproducts in the plasma reaction chamber 102.

Figure 5:
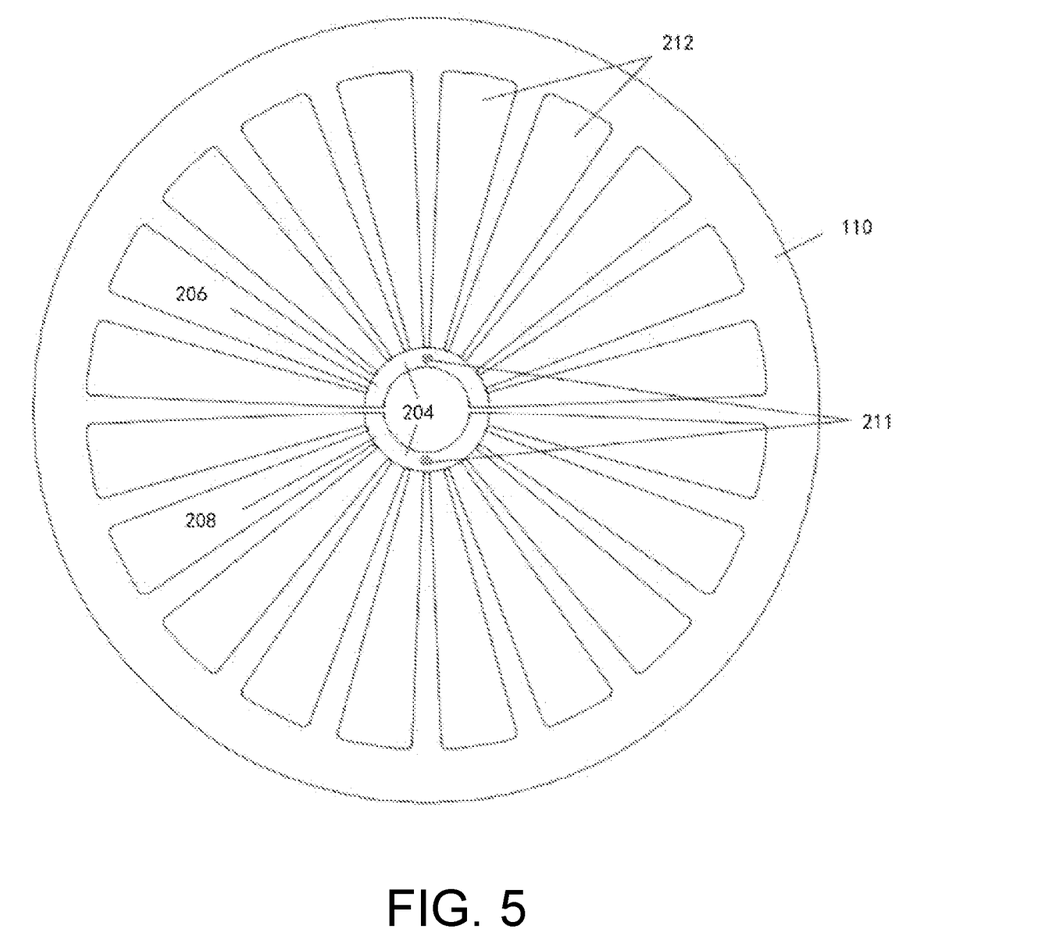
FIG. 5 is a schematic diagram of a petal-shaped faraday structure in an ICP processing system in the present application.

As shown in FIG. 5, the faraday shielding device 160 is formed by a group of petal sheet-shaped components 212 of the same shape. Slits between every two adjacent petal sheet-shaped components 212 are of the same shape and size. The petal sheet-shaped components 212 are rotationally symmetrically distributed around a vertical axis. An end of each petal sheet-shaped component 212 close to the vertical axis is connected to a conductive member 204. The conductive member 204 is formed by two sector conductive members that are of the same radian and size and are separate and insulated from each other. The conductive member 204 is sprayed on the electrical lead post 211. The two sector conductive members are connected in parallel by the electrical lead post 211 and the electrical lead wire 210 to the radio frequency matching network A106 to implement a connection to the excitation radio frequency power source 104.

The diameter of the faraday shielding device 160 is greater than 80% of the diameter of the substrate 120. The radius of the conductive member 204 does not exceed 10% of the radius of the substrate. During a plasma processing process, when the radio frequency power is coupled into the radio frequency coil 108 through the matching network A106. The faraday shielding device 160 is grounded by the electrical lead post 211 and the electrical lead wire 210 or is floating to reduce the erosion of the inner wall of the chamber, especially the dielectric window 110, by the plasma, thereby reducing a cleaning time after the process ends. The floating is that the faraday shielding device 160 is neither grounded nor connected to radio frequency.

Embodiment 2

As shown in FIG. 1, an ICP processing system is provided. The ICP processing system includes a plasma reaction chamber 102, an excitation radio frequency power source 104, a matching network A106, a radio frequency coil 108, a dielectric window 110, a bias radio frequency power source 114, a matching network B116, an electrode 118, a substrate 120, a gas source 130, a gas inlet 140, a pressure control valve 142, a vacuum pump 144, and a three-way switch 150. The excitation radio frequency power source 104 is tuned by the matching network A106 and then supplies power to the radio frequency coil 108 located above the dielectric window 110 through the three-way switch 150 after tuning. The plasma 112 is generated in the plasma reaction chamber 102 through inductive coupling. The bias radio frequency power source 114 supplies power to the electrode 118 through the matching network B116. The substrate 120 is placed on the electrode 118. The radio frequency coil 108 includes N2 sub-coils. The radio frequency coil 108 has one radio frequency power source. The gas source 130 is connected to the plasma reaction chamber 102 by the gas inlet 140. The pressure control valve 142 and the vacuum pump 144 maintain the plasma reaction chamber 102 at 1 mtorr to 100 mtorr, and remove excess gas and reaction byproducts in the plasma reaction chamber 102. The excitation radio frequency power source 104 and the bias radio frequency power source 114 are both set to a specific frequency, and the specific frequency is one or a combination of a plurality of frequencies 400 KHz, 2 MHz, 13.56 MHz, 27 MHz, 60 MHz, and 2.54 GHz.

As shown in FIG. 3 and FIG. 4, an yttrium oxide coating is sprayed at the bottom of the dielectric window 110. The thickness of the yttrium oxide coating is greater than or equal to 50 micrometers. A layer of a faraday shielding device 160 is sprayed on the yttrium oxide coating. A thickness of the spraying is greater than or equal to 50 micrometers. To prevent the faraday shielding device 160 from contaminating the chamber and to protect the dielectric window 110 and the faraday shielding device 160 from being damaged by process etching, a spraying range of the yttrium oxide coating is greater than a maximum diameter of the faraday shielding device 160. The dielectric window 110 is manufactured by sintering aluminum oxide. An electrical lead post 211 is sintered or brazed at the bottom of the dielectric window 110. The electrical lead post 211 is connected to an electrical lead wire 210 and is connected to the three-way switch 150 by the electrical lead wire 210. The material of the faraday shielding device 160 is silicon carbide or zinc oxide. When the electrical lead post 211 and the dielectric window 110 are sintered together, the material of the electrical lead post 211 is copper, silver, gold or palladium with a high coefficient of electrical conductivity.

When the electrical lead post 211 and the dielectric window 110 are brazed together, the material of the electrical lead post 211 is Kovar.

As shown in FIG. 2, during a plasma processing process, the substrate 120 is placed in the plasma reaction chamber 102, the plasma processing process reaction gas that enters the plasma reaction chamber 102 from the gas source 130 is introduced into the reaction chamber, and the pressure control valve 142 and the vacuum pump 144 maintain the plasma reaction chamber 102 at 1 mtorr to 100 mtorr. An on position of the three-way switch 150 is switched to enable the excitation radio frequency power source 104 to be tuned by the matching network A106 to supply power to the radio frequency coil 108 located above the dielectric window 110. The plasma 112 is generated in the plasma reaction chamber 102 through inductive coupling to perform the plasma processing process on the substrate 120. After the plasma processing process is completed, input of radio frequency power from the excitation radio frequency power source 104 is stopped, and feeding of the plasma processing process reaction gas from the gas source 130 is stopped. When a cleaning process is required, the substrate 120 is placed in the plasma reaction chamber 102. Cleaning process reaction gas is introduced into the plasma reaction chamber 102. The pressure control valve 142 and the vacuum pump 144 maintain the plasma reaction chamber 102 at 1 mtorr to 100 mtorr. The on position of the three-way switch 150 is switched to enable the excitation radio frequency power source 104 to be tuned by the matching network A106 to supply power to the faraday shielding device 160 located between the dielectric window 110 and the radio frequency coil 108. The radio frequency power is coupled into the faraday shielding device 160. The plasma reaction chamber and the dielectric window are cleaned. After the cleaning process is completed, the input of the radio frequency power from the excitation radio frequency power source 104 is stopped, and the feeding of the cleaning process reaction gas from the gas source 130 is stopped. Specific operations of the ICP processing system when the cleaning process is required are as follows: Through switching of the three-way switch 150, the excitation radio frequency power source 104 is tuned by the matching network A106 to supply power to the faraday shielding device 160 through the electrical lead wire 210 and the electrical lead post 211. The gas source 130 is connected to the plasma reaction chamber 102 by the gas inlet 140. The cleaning process reaction gas is introduced into the plasma reaction chamber 102. The pressure control valve 142 and the vacuum pump 144 maintain the plasma reaction chamber 102 at 1 mtorr to 100 mtorr, and remove excess gas and reaction byproducts in the plasma reaction chamber 102.

Figure 6:
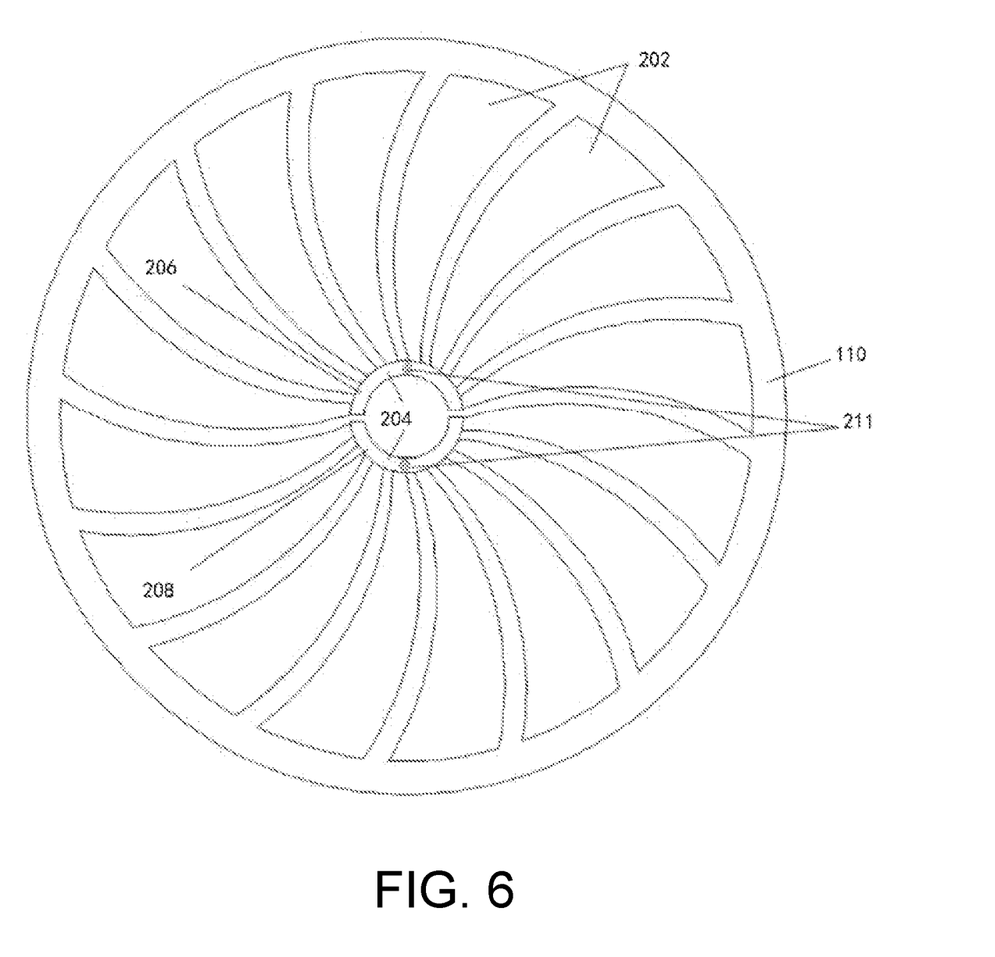
FIG. 6 is a schematic diagram of a blade-shaped structure in an ICP processing system in the present application.

As shown in FIG. 6, the faraday shielding device 160 is formed by a group of blade sheet-shaped components 202 of the same shape. Slits between every two adjacent blade sheet-shaped components 202 are of the same shape and size. The blade sheet-shaped components 202 are rotationally symmetrically distributed around a vertical axis. An end of each blade sheet-shaped component 202 close to the vertical axis is connected to a conductive member 204. The conductive member 204 is formed by two sector conductive members that are of the same radian and size and are separate and insulated from each other. The conductive member 204 is sprayed on the electrical lead post 211. The two sector conductive members are connected in parallel by the electrical lead post 211 and the electrical lead wire 210 to the radio frequency matching network A106 to implement a connection to the excitation radio frequency power source 104.

The diameter of the faraday shielding device 160 is greater than 80% of the diameter of the substrate 120. The radius of the conductive member 204 does not exceed 10% of the radius of the substrate. During a plasma processing process, when the radio frequency power is coupled into the radio frequency coil 108 through the matching network A106. The faraday shielding device 160 is grounded by the electrical lead post 211 and the electrical lead wire 210 or is floating to reduce the erosion of the inner wall of the chamber, especially the dielectric window 110, by the plasma, thereby reducing a cleaning time after the process ends. The floating is that the faraday shielding device 160 is neither grounded nor connected to radio frequency.

What is claimed is:

1. An inductively coupled plasma (ICP) processing system, comprising a plasma reaction chamber, an excitation radio frequency power source, a matching network A, a radio frequency coil, a dielectric window, a bias radio frequency power source, a matching network B, an electrode, a substrate, a gas source, a gas inlet, a pressure control valve, a vacuum pump, and a three-way switch, wherein the excitation radio frequency power source is tuned by the matching network A, and then supplies power to the radio frequency coil located above the dielectric window through the three-way switch after tuning, plasma is generated in the plasma reaction chamber through inductive coupling, the bias radio frequency power source supplies power to the electrode through the matching network B, and the substrate is placed on the electrode; the radio frequency coil comprises two or more sub-coils, and the radio frequency coil has one radio frequency power source; and the gas source is connected to the plasma reaction chamber by the gas inlet, and the pressure control valve and the vacuum pump maintain the plasma reaction chamber at 1 mtorr to 100 mtorr, and remove excess gas and reaction byproducts in the plasma reaction chamber.

2. The ICP processing system according to claim 1, wherein the excitation radio frequency power source and the bias radio frequency power source are both set to a specific frequency, and the specific frequency is, for example, one or a combination of a plurality of frequencies 400 KHz, 2 MHz, 13.56 MHz, 27 MHz, 60 MHz, and 2.54 GHz.

3. The ICP processing system according to claim 1, wherein an yttrium oxide coating is sprayed at the bottom of the dielectric window, a thickness of the yttrium oxide coating is greater than or equal to 50 micrometers, a layer of a faraday shielding device is sprayed on the yttrium oxide coating, a thickness of the spraying is greater than or equal to 50 micrometers, to prevent the faraday shielding device from contaminating the chamber and to protect the dielectric window and the faraday shielding device from being damaged by process etching, a spraying range of the yttrium oxide coating is greater than a maximum diameter of the faraday shielding device, the dielectric window is manufactured by sintering aluminum oxide, an electrical lead post is sintered or brazed at the bottom of the dielectric window, and the electrical lead post is connected to an electrical lead wire and is connected to the three-way switch by the electrical lead wire.

4. The ICP processing system according to claim 3, wherein the material of the faraday shielding device is silicon carbide or zinc oxide.

5. The ICP processing system according to claim 3, wherein when the electrical lead post and the dielectric window are sintered together, the material of the electrical lead post is copper, silver, gold or palladium with a high coefficient of electrical conductivity, and when the electrical lead post and the dielectric window are brazed together, the material of the electrical lead post is Kovar.

6. The ICP processing system according to claim 5, wherein during a plasma processing process, the substrate is placed in the plasma reaction chamber, plasma processing process reaction gas that enters the plasma reaction chamber from the gas source is introduced into the reaction chamber, the pressure control valve and the vacuum pump maintain the plasma reaction chamber at 1 mtorr to 100 mtorr, an on position of the three-way switch is switched to enable the excitation radio frequency power source to be tuned by the matching network A to supply power to the radio frequency coil located above the dielectric window, plasma is generated in the plasma reaction chamber through inductive coupling to perform the plasma processing process on the substrate, after the plasma processing process is completed, input of radio frequency power from the excitation radio frequency power source is stopped, and feeding of the plasma processing process reaction gas from the gas source is stopped, when a cleaning process is required, the substrate is placed in the plasma reaction chamber, cleaning process reaction gas is introduced into the plasma reaction chamber, the pressure control valve and the vacuum pump maintain the plasma reaction chamber at 1 mtorr to 100 mtorr, the on position of the three-way switch is switched to enable the excitation radio frequency power source to be tuned by the matching network A to supply power to the faraday shielding device located between the dielectric window and the radio frequency coil, the radio frequency power is coupled into the faraday shielding device, the plasma reaction chamber and the dielectric window are cleaned, and after the cleaning process is completed, the input of the radio frequency power from the excitation radio frequency power source is stopped, and the feeding of the cleaning process reaction gas from the gas source is stopped.

7. The ICP processing system according to claim 6, wherein specific operations of the ICP processing system when the cleaning process is required are as follows: through switching of the three-way switch, the excitation radio frequency power source is tuned by the matching network A to supply power to the faraday shielding device through the electrical lead wire and the electrical lead post, the gas source is connected to the plasma reaction chamber by the gas inlet, the cleaning process reaction gas is introduced into the plasma reaction chamber, and the pressure control valve and the vacuum pump maintain the plasma reaction chamber at 1 mtorr to 100 mtorr, and remove excess gas and reaction byproducts in the plasma reaction chamber.

8. The ICP processing system according to claim 3, wherein the faraday shielding device is formed by a group of petal sheet-shaped components of the same shape, slits between every two adjacent petal sheet-shaped components are of the same shape and size, the petal sheet-shaped components are rotationally symmetrically distributed around a vertical axis, an end of each petal sheet-shaped component close to the vertical axis is connected to a conductive member, the conductive member is formed by two sector conductive members that are of the same radian and size and are separate and insulated from each other, the conductive member is sprayed on the electrical lead post, and the two sector conductive members are connected in parallel by the electrical lead post and the electrical lead wire to the radio frequency matching network A to implement a connection to the excitation radio frequency power source.

9. The ICP processing system according to claim 3, wherein the faraday shielding device is formed by a group of blade sheet-shaped components of the same shape, slits between every two adjacent blade sheet-shaped components are of the same shape and size, the blade sheet-shaped components are rotationally symmetrically distributed around a vertical axis, an end of each blade sheet-shaped component close to the vertical axis is connected to a conductive member, the conductive member is formed by two sector conductive members that are of the same radian and size and are separate and insulated from each other, the conductive member is sprayed on the electrical lead post, and the two sector conductive members are connected in parallel by the electrical lead post and the electrical lead wire to the radio frequency matching network A to implement a connection to the excitation radio frequency power source.

10. The ICP processing system according to claim 1, wherein the diameter of the faraday shielding device is greater than 80% of the diameter of the substrate, the radius of the conductive member does not exceed 10% of the radius of the substrate, during a plasma processing process, when the radio frequency power is coupled into the radio frequency coil through the matching network A, the faraday shielding device is grounded by the electrical lead post and the electrical lead wire or is floating to reduce the erosion of the inner wall of the chamber, especially the dielectric window, by the plasma, thereby reducing a cleaning time after the process ends, and the floating is that the faraday shielding device is neither grounded nor connected to radio frequency.

* * * * *